US009076558B2

(12) United States Patent
Cheng

(10) Patent No.: US 9,076,558 B2
(45) Date of Patent: Jul. 7, 2015

(54) MEMORY TEST SYSTEM AND MEMORY TEST METHOD

(71) Applicant: Wen-Chang Cheng, Taoyuan (TW)

(72) Inventor: Wen-Chang Cheng, Taoyuan (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 311 days.

(21) Appl. No.: 13/666,934

(22) Filed: Nov. 1, 2012

(65) Prior Publication Data
US 2014/0122948 A1 May 1, 2014

(51) Int. Cl.
G11C 29/00 (2006.01)
G11C 29/56 (2006.01)

(52) U.S. Cl.
CPC .. *G11C 29/56012* (2013.01); *G11C 2029/5602* (2013.01)

(58) Field of Classification Search
CPC ........ G11C 29/56; G11C 29/40; G11C 29/44; G11C 29/10; G11C 29/48; G11C 29/50; G11C 29/56012; G11C 2029/5602; H05K 999/99
See application file for complete search history.

(56) References Cited

U.S. PATENT DOCUMENTS

| | | | | |
|---|---|---|---|---|
| 5,946,712 A * | 8/1999 | Lu et al. | | 711/167 |
| 6,069,758 A * | 5/2000 | Chung | | 360/31 |
| 6,101,622 A * | 8/2000 | Lesmeister | | 714/724 |
| 6,154,821 A * | 11/2000 | Barth et al. | | 711/170 |
| 6,182,253 B1 * | 1/2001 | Lawrence et al. | | 714/718 |
| 6,304,947 B1 * | 10/2001 | Killig et al. | | 711/154 |
| 8,289,795 B1 * | 10/2012 | Hsu | | 365/203 |
| 8,423,842 B2 * | 4/2013 | Nakano et al. | | 714/721 |
| 2005/0135167 A1 * | 6/2005 | Manabe | | 365/201 |
| 2005/0216799 A1 * | 9/2005 | Azimane | | 714/718 |
| 2006/0041730 A1 * | 2/2006 | Larson | | 711/167 |
| 2006/0291308 A1 * | 12/2006 | Yusa | | 365/201 |
| 2009/0083744 A1 * | 3/2009 | Shimada | | 718/102 |
| 2009/0219774 A1 * | 9/2009 | Kim | | 365/201 |
| 2009/0224784 A1 * | 9/2009 | Pagani | | 324/754 |
| 2010/0008158 A1 * | 1/2010 | Swain et al. | | 365/189.07 |
| 2010/0037231 A1 * | 2/2010 | Chen et al. | | 718/104 |

(Continued)

FOREIGN PATENT DOCUMENTS

| | | |
|---|---|---|
| TW | 200703354 | 1/2007 |
| TW | 200809235 | 2/2008 |
| TW | 201101322 | 1/2011 |

OTHER PUBLICATIONS

"Office Action of Taiwan Counterpart Application," issued on Apr. 24, 2015, p1-p8, in which the listed references were cited.

*Primary Examiner* — Albert Decady
*Assistant Examiner* — Enamul M Kabir
(74) *Attorney, Agent, or Firm* — Jianq Chyun IP Office

(57) ABSTRACT

A memory test system and a memory test method are provided. The memory test system includes a control unit, a data reading channel, a data writing channel and a test channel. The control unit generates and outputs a first read and a first write command. The data reading channel and the data writing channel coupled to the memory unit, and the control unit respectively reads data from the memory unit at a first time and writes the data back to the memory unit at a second time according to the first read command and the first write command. The test channel receives the data from the data reading channel through an input end and outputs the data back to the data writing channel through an output end after a time delay. The time delay is substantially equal to a time interval between the first time and the second time.

18 Claims, 3 Drawing Sheets

(56) References Cited

U.S. PATENT DOCUMENTS

| | | | |
|---|---|---|---|
| 2010/0182859 A1* | 7/2010 | Kohler et al. | 365/201 |
| 2012/0014011 A1* | 1/2012 | Wilson | 360/39 |
| 2012/0102262 A1* | 4/2012 | Nango et al. | 711/103 |
| 2012/0260130 A1* | 10/2012 | Li | 714/32 |
| 2013/0198420 A1* | 8/2013 | Nishikawa et al. | 710/57 |

* cited by examiner and a data writing channel, a transmission unit, a reception unit and a loopback channel, wherein the transmission unit, the reception unit and the loopback channel are called as a test channel. The loopback channel consists of a first pad, a transmission channel and a second pad which physically connects transmission unit and reception unit. The memory unit, the control unit, the data reading channel, the data writing channel, the transmission unit and the reception unit are all to be tested. The control unit generates and outputs a first read command and a first write command according to an external command. The data reading channel coupled to the memory unit and the control unit reads data from the memory unit according to the first read command. The data writing channel coupled to the memory unit and the control unit writes the data to the memory unit according to the first write command. The test channel is coupled to the data reading channel and the data writing channel, and has an input end and an output end. The input end receives the data from the data reading channel and the output end transmits the data back to the data writing channel. After a time delay, the data writing channel receives the data. When each time the external command is received by the control unit, the first read command and the first write command are generated and respectively outputted to the data reading channel and the data writing channel. The data reading channel receives the first read command at a first time before the data writing channel receives the first write command at a second time. A time interval between the first time and the second time is substantially equal to the time delay, and the time interval includes a generation time of the first write command by the control unit and a programmable offset time.

MEMORY TEST SYSTEM AND MEMORY TEST METHOD

BACKGROUND OF THE INVENTION

1. Field of the Invention

The present invention relates to a test system and a test method, and more particularly to a memory test system and a memory test method.

2. Description of Related Art

Advance in technology has enabled the high speed computer system. Thanks to the well researched and developed electronic devices, such as microprocessors and memories, it is possible for the computer system to operate in the high speed environment but still keep the good performance. However, interconnections between electronic devices in the high speed environment such as I/O interface and memory become very sensitive, so careful testing and setting are required.

In order to validate the high speed I/O interface and memory, various parameters like voltage and timing should be measured under different conditions. By doing so, the computer system can be perfectly studied and set to meet the required performance of the high speed system. However, a traditional testing tool for testing I/O interface and memory is expensive and inconvenient. Therefore, to develop a test system and a test method without using the external testing tool is still a main topic for the person who skilled in the art.

SUMMARY OF THE INVENTION

The invention is directed to a memory test system and a memory test method, and the memory test system is capable of testing the memory in high speed environment.

An exemplary embodiment of the invention provides a memory test system for testing a memory unit including a control unit, a data reading channel, a data writing channel, a transmission unit, a reception unit and a loopback channel, wherein the transmission unit, the reception unit and the loopback channel are called as a test channel. The loopback channel consists of a first pad, a transmission channel and a second pad which physically connects transmission unit and reception unit. The memory unit, the control unit, the data reading channel, the data writing channel, the transmission unit and the reception unit are all to be tested. The control unit generates and outputs a first read command and a first write command according to an external command. The data reading channel coupled to the memory unit and the control unit reads data from the memory unit according to the first read command. The data writing channel coupled to the memory unit and the control unit writes the data to the memory unit according to the first write command. The test channel is coupled to the data reading channel and the data writing channel, and has an input end and an output end. The input end receives the data from the data reading channel and the output end transmits the data back to the data writing channel. After a time delay, the data writing channel receives the data. When each time the external command is received by the control unit, the first read command and the first write command are generated and respectively outputted to the data reading channel and the data writing channel. The data reading channel receives the first read command at a first time before the data writing channel receives the first write command at a second time. A time interval between the first time and the second time is substantially equal to the time delay, and the time interval includes a generation time of the first write command by the control unit and a programmable offset time.

In one exemplary embodiment of the invention, the programmable offset time is adjusted by the control unit such that the time interval is substantially equal to the time delay.

In one exemplary embodiment of the invention, the time delay is rendered when the data is read from the memory unit by the data reading channel, outputted to the input end of the test channel and transmitted back to the data writing channel.

In one exemplary embodiment of the invention, the data reading channel includes at least one multiplexer which selects memory banks of the memory unit to read the data according to the first read command.

In one exemplary embodiment of the invention, the data writing channel includes at least one multiplexer which selects the memory banks of the memory unit to write the data according to the first write command.

In one exemplary embodiment of the invention, the memory unit includes at least one memory array, and the data is read from and written into a same memory bank or the different memory banks of the at least one memory array.

In one exemplary embodiment of the invention, the data is read from and written into a same column address or the different column addresses of the at least one memory array.

In one exemplary embodiment of the invention, the test channel includes the first pad, the second pad and the transmission channel, the first pad is coupled to the input end, the second pad is coupled to the output end, and the transmission channel is coupled between the first pad and the second pad, the data is transmitted from the first pad to the second pad through the transmission channel.

In one exemplary embodiment of the invention, the test channel further includes the reception unit and the transmission unit. The transmission unit is coupled between the input end and the first pad for receiving the data from the data reading channel and transmitting the data to the first pad. The first pad is coupled to the input end through the transmission unit. The reception unit is coupled between the second pad and the output end for receiving the data from the second pad and transmitting the data to the data writing channel, and the second pad is coupled to the output end via the reception unit.

In one exemplary embodiment of the invention, the external command is an external write command, an external read command or an external write and read command.

In one exemplary embodiment of the invention, the external command operates in a first frequency, the data reading channel and the data writing channel operate in a second frequency and the test channel operates in a third frequency.

Another exemplary embodiment of the invention provides a memory test method adapted by a control unit. The memory test method includes the following steps. According to an external command, a first read command and a first write command are generated. The first read command is outputted to a data reading channel in order to read data from a memory unit at a first time. The data is transmitted to an input end of a test channel by the data reading channel. The data is received by a data writing channel from an output end of the test channel after a time delay, and the first write command is outputted to the data writing channel to write the data into the memory unit in a second time. A time interval between the first time and the second time is substantially equal to the time delay, and the time interval includes a generation time of the first write command and a programmable offset time.

In one embodiment of the invention, the memory test method further includes the following step. The programmable offset time is adjusted so that the time interval is substantially equal to the time delay.

In one exemplary embodiment of the invention, the time delay is rendered when the data is read from the memory unit by the data reading channel, outputted to the input end of the test channel and transmitted back to the data writing channel.

In one embodiment of the invention, the method of reading the data from the memory unit and writing the data into the memory unit further includes the step that the memory banks of the memory unit are selected for reading and writing the data according to the first read command and the first write command.

In one embodiment of the invention, the memory unit includes at least one memory array, and the method of reading the data from the memory unit and writing the data into the memory unit further includes the step that a same memory bank or different memory banks of at least one memory array are selected to read and write the data.

In one embodiment of the invention, the method of reading the data from the memory unit and writing the data into the memory unit further includes the step that a same column address or different column addresses of the at least one memory array are selected to read and write the data.

In one embodiment of the invention, the memory test method further includes the following step. The external command which is an external read command, an external write command or an external read and write command is received before generating the first read command and the first write command.

According to the above descriptions, the memory test system in the present invention outputs the first write command after the first read command in waiting for a period of the time interval. The time interval includes the programmable offset time that can be adjusted so that the time interval is substantially equal to the time delay. By controlling the correct timing for outputting the first read command and the first write command, a high speed test environment without using external tool is provided.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DETAILED DESCRIPTION OF DISCLOSED EMBODIMENTS

Figure 1:
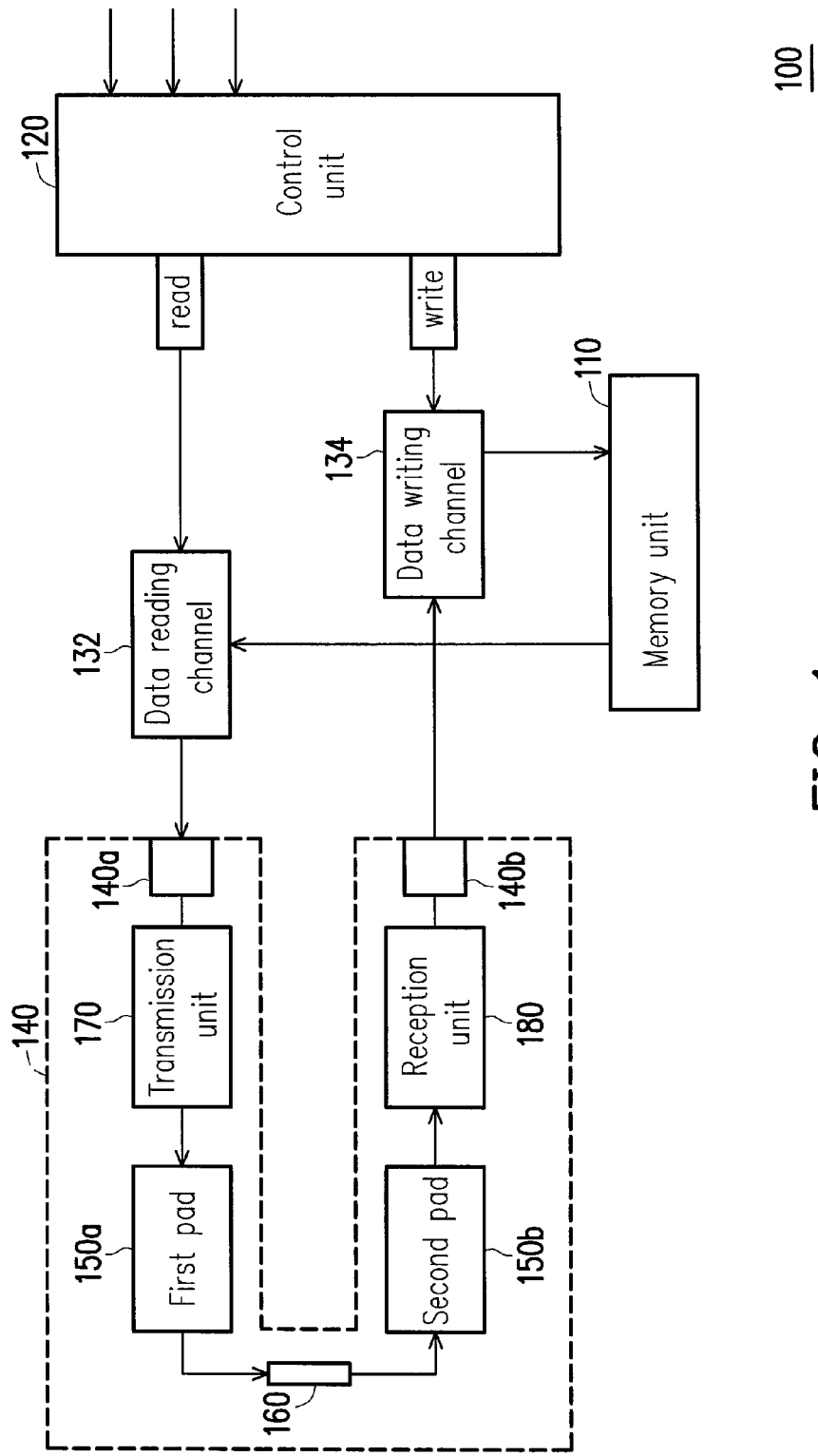
FIG. 1 illustrates a schematic diagram of a memory test system 100 according to an exemplary embodiment of the invention.

Referring to FIG. 1, FIG. 1 illustrates a schematic diagram of a memory test system 100 according to an exemplary embodiment of the invention. In an exemplary embodiment of the present invention, the memory test system 100 for testing a memory unit 110 includes a control unit 120, a data reading channel 132, a data writing channel 134 and a test channel 140. The control unit 120 is configured for generating and outputting a first read command and a first write command according to an external command. The data reading channel 132 coupled to the memory unit 110 and the control unit 120 is applied for reading data from the memory unit 110 according to the first read command, and the data writing channel 134 coupled to the memory unit 110 and the control unit 120 is applied for writing the data to the memory unit 110 according to the first write command.

In the previous exemplary embodiment, the test channel 140 is coupled to the data reading channel 132 and the data writing channel 134, and the test channel 140 has an input end 140a and an output end 140b. The input end 140a receives the data from the data reading channel 132 and the output end 140b transmits the data back to the data writing channel 134. After a time delay, the data writing channel 134 receives the data. When each time the external command is received by the control unit 120, the first read command and the first write command are generated and respectively outputted to the data reading channel 132 and the data writing channel 134. The data reading channel 132 receives the first read command at a first time before the data writing channel 134 receives the first write command at a second time. A time interval between the first time and the second time is substantially equal to the time delay, and the time interval includes a generation time of the internal write command by the control unit 120 and a programmable offset time.

According to the above description, a path for transmitting data in order to measure some parameters such as voltage and timing in a high speed environment is briefly described. A detailed description of the memory test system 100 in the exemplary embodiment is provided below. The memory test of the memory test system 100 is triggered by the external command. Although the external command may be different kinds of commands like an external write command, an external read command or an external write and read command which only indicates a specific operation of the device, the control unit 120 generates both the first write command and the first read command for the memory test system 100. In other words, the types of the commands generated by the control unit 120 in the memory test system 100 will not be affected by the types of the external commands. Moreover, the external command, the data reading channel 132, the data writing channel 134 and the test channel 140 operate in different frequencies. The external command operates in a first frequency, the data reading channel 132 and the data writing channel operate in a second frequency, and the test channel 140 operates in a third frequency. For example, the external command operates in 3 Gb/s, the data reading channel and the data writing channel operate in 0.75 Gb/s and the test channel operates in 6 Gb/s.

After the time interval, the first write command should be outputted to the data writing channel 134, where the first read command is already outputted to the data reading channel 132. Therefore, the data reading channel 132 first receives the internal read command. In the data reading channel 132, at least one multiplexer (MUX) is disposed to execute the first read command and read the data from the memory unit 110. The memory unit 110 can be a memory array, a register, a flip_flop or a latch. For convenience, the following specification only takes the memory array as an example. When the data reading channel 132 reads the data from the memory unit 110, the multiplexer selects memory banks (not illustrated) of the memory unit 110 according to the first read command to read the data. Base on the above description, the memory unit 110 may be a memory array, so the data can be read from a column address of the memory array.

After the memory unit 110 reading process is complete, the data are transmitted to the test channel 140. The input end 140a of the test channel 140 is responsible for receiving the data from the data reading channel 132, and the output end 140b of the test channel 140 is responsible for transmitting the data back to the data writing channel 134. To be more specific, according to the exemplary embodiment, the test channel 140 further includes a first pad 150a, a second pad 150b and a transmission channel 160. The first pad 150a is coupled to the input end 140a, the second pad 150b is coupled to the output end 140b and the transmission channel 160 is coupled between the first pad 150a and the second pad 150b. Therefore the data is transmitted from the input end 140a to the output end 140b through the first pad 150a, the transmission channel 160 and the second pad 150b.

However, the test channel 140 is not limited thereto, and a reception unit 180 and a transmission unit 170 are disposed in the test channel 140. The transmission unit 170 is coupled between the input end 140a and the first pad 150a, and the reception unit 180 is coupled between the output end 140b and the second pad 150b. In other words, the first pad 150a is coupled to the input end 140a via the transmission unit 170, and the second pad 150b is coupled to the output end 140b via the reception unit 180. The transmission unit 170 is capable of processing the data received by the input end 140a and transmitting the data to the first pad 150a. The reception unit 180 is capable of processing the data prepared to be outputted by the output end 140b and outputting the data to the data writing channel 134. The first pad 150a, the second pad 150b and the transmission channel 160 are called as a loopback channel. Further, the transmission unit 170, the reception unit 180 and the loopback channel are called as the test channel 140. A First-in-First-out (FIFO, not illustrated) unit can be disposed in the transmission unit 170 for buffering the data, and a Serial-to-Parallel (S2P, not illustrated) unit can be disposed in the reception unit 180 for performing the serial to parallel operation to the data.

The data is transmitted back to the data writing channel 134 by the test channel 140 through the output end 140b. When the data is transmitted back to the data writing channel 134, the data writing channel 134 performs a write process to the data according to the first write command from the control unit 120. Like the data reading channel 132, at least one multiplexer (MUX) is disposed in the data writing channel 134 to execute the first write command and write the data into the memory unit 110. If the first write command is received by the multiplexer, the multiplexer selects memory banks of the memory unit 110 for writing the data. Moreover, the data reading channel 132 and the data writing channel 134 can select the different memory banks for respectively reading the data and writing the data. The data can also be written into a column address which is different to the column address where the data is read by the data reading channel 132. The first read command indicates that which memory bank and column address is the target for the data reading channel 132 to read the data, and the first write command also indicates that which memory bank and column address is the target for the data writing channel 134 to write the data. As a result, the same memory bank or the same column address of the at least one memory array can be selected to read and write the data as well.

Since the previous described transmission process is performed in a high speed environment, several important parameters such as the voltage and the timing can be found by regarding and comparing the original data and the received data. However, the time delay may be a serious problem in the high speed environment. In the memory test system 100, the time delay is rendered when the data is read from the memory unit 110 by the data reading channel 132, outputted to the input end 140a of the test channel 140 and transmitted back to the data writing channel 134. Therefore, if the control unit 120 output the first read command and the first write command at the same time, the data reading channel 132 and the data writing channel are unable to write the same data back into the assigned column address and the assigned memory bank of the memory unit 110. As a result, the memory test system 100 is unable to provide the correct data to be compared and regarded. In the memory test system 100, the time interval between the first time and the second time includes the programmable offset time, so the time interval may be adjusted to solve the time delay problem. Accordingly, the time delay should be considered as an important factor which can seriously affect the memory test system 100.

Figure 2:
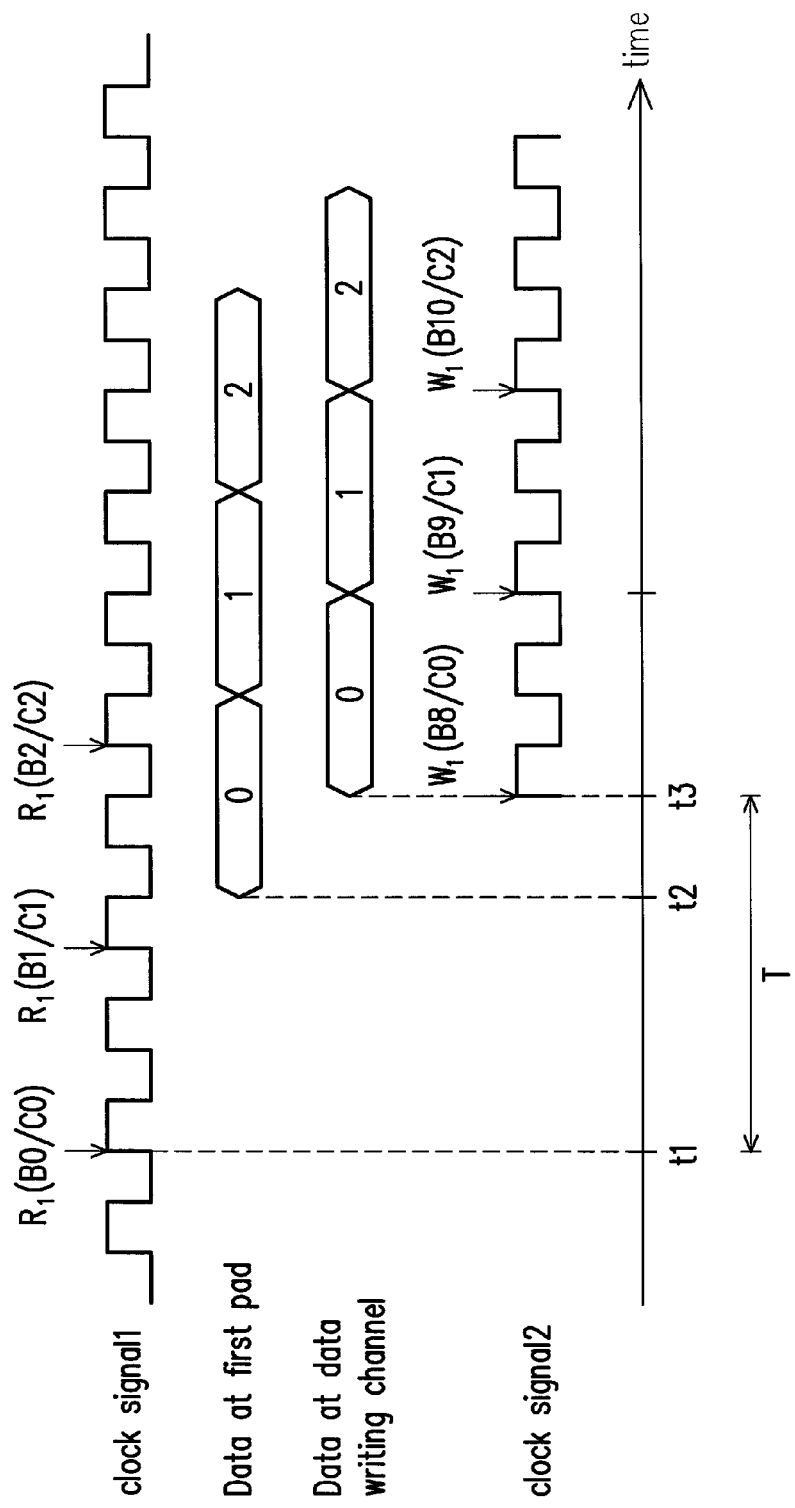
FIG. 2 is a timing diagram of the data transmitted in the memory test system 100 according to an exemplary embodiment of the invention.

FIG. 2 is a timing diagram of the data transmitted in the memory test system according to an exemplary embodiment of the invention. In FIG. 2, a clock signal is used to represent time periods. Referring to FIG. 1 and FIG. 2, in an exemplary embodiment, a first read command $R_1$ (B0/C0) is outputted to the data reading channel 132 at time t1. To response to the first read command, the data reading channel 132 reads the data from the memory unit 110. After several clock cycles, the data is transmitted to the first pad 150a of the test channel 140 at time t2. In the test channel 140, the data is transmitted through the transmission unit 170, the first pad 150a, the transmission channel 160, the second pad 150b and the reception unit 180 to reach the output end 140b of the test channel 140. When the data is transmitted to the data writing channel 134 at time t3, the control unit 120 has to output the first write command $W_1$ (B8/C0) to the data writing channel 134 in order to correctly write the data to the assigned memory back and the assigned address.

Accordingly, the interval T between time t1 and t3 is the time delay, and the time delay can be several clock cycles. In other words, the time delay is rendered because of the transmission path in the test channel 140. To solve the problem caused by the time delay, the memory test system 100 respectively transmits the first read command and the first write command at the first time and the second time. Referring to the FIG. 2, the first time of outputting the first read command to the data reading channel 132 by the control unit 120 should be the time t1, and the second time of outputting the first write command to the data writing channel 134 by the control unit 120 should be the time t3. The time interval between the first time and the second time includes a generation time of the first write command by the control unit 120 and a programmable offset time. Because the generation time of the first write command is fixed, the control unit 120 adjusts the programmable offset time to control the time interval. As the result, the time interval is adjusted to substantially equal to the time delay, and the data can be correctly stored to the assigned memory bank and assigned column address.

It should be noted that, in FIG. 2, the first read command reads the data from the memory bank 0 and the column address 0 ($R_1$ B0/C0), but the first write command writes the data into the memory bank 8 and the column address 0 ($W_1$ B8/C0). The similar deduction can be made to other first read commands and first write commands.

Figure 3:
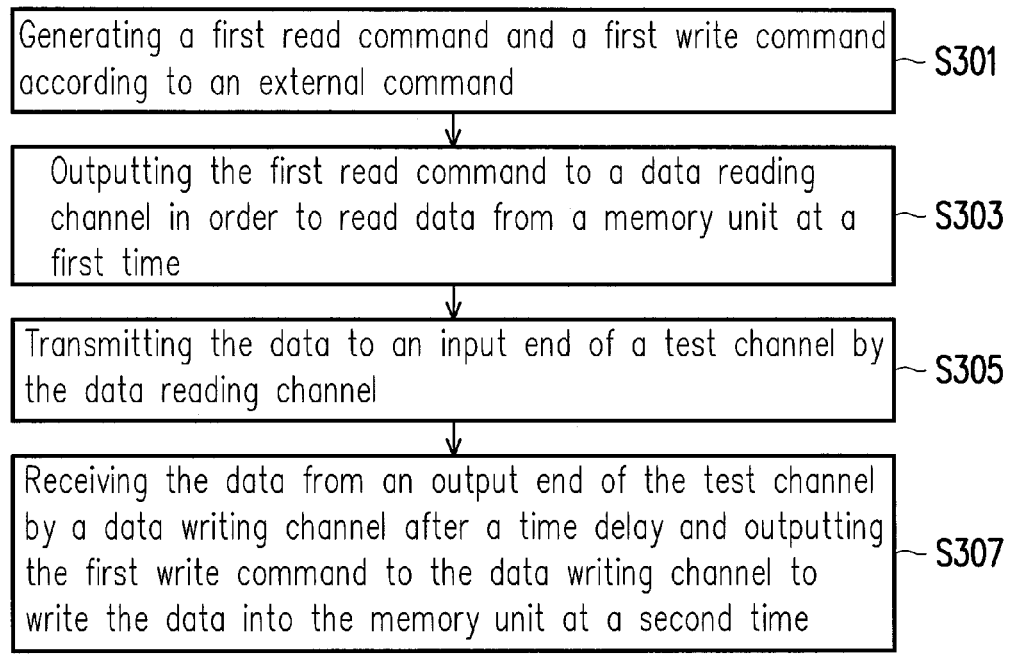
FIG. 3 illustrates a flowchart of the memory test method in the exemplary embodiment of the present invention.

A memory test method adapted by a control unit in an exemplary embodiment of the present invention is also provided herein. Referring to FIG. 3, FIG. 3 illustrates a flowchart of the memory test method in the exemplary embodiment of the present invention. For one exemplary embodiment, the memory test method includes the following steps. First, in step 301, a first read command and a first write command are generated according to an external command. The external command may be an external read command or an external write command. In step 303, the first read command is outputted to a data reading channel in order to read the data from a memory unit at a first time. In step 305, the data is transmitted to an input end of a test channel by the data writing channel. In step 307, the data is received by a data writing channel from an output end of the test channel after a time delay and the first write command is outputted to the data writing channel at a second time to write the data into the memory unit. The time interval between the first time and the second time is substantially equal to the time delay, and the time interval includes a generation time of the first write command and a programmable offset time.

Since the first read command and the first write command are generated according to the external command, the memory test method further includes the step that the external command is received by the control unit before generating the first read command and the first write command.

The memory test method also includes the steps for reading data from and writing data into the memory unit. Since the data is stored in the memory unit, memory banks of the memory unit are selected to read and write the data by the data reading channel and the data writing channel.

The memory unit can be a memory array, a register or a flip_flop. Taking the memory array as an example, the memory test method includes that the same memory bank or the different memory banks of at least one memory array can be selected to read and write the data. Accordingly, a same column address or different column addresses of the at least one memory array can be selected to read and write the data.

Since the time interval should be substantially equal to the time delay in order to correctly write the data into the memory unit, the memory test method further includes the step that the programmable offset time is adjusted so that the time interval is substantially equal to the time delay. In the present exemplary embodiment, the programmable offset time can be adjusted by the control unit.

In summary, according to the exemplary embodiments of the present invention, a memory test system for testing a memory unit includes a control unit, a data reading channel, a data writing channel and a test channel. The data reading channel reads the data from a memory unit at a first time, and the data is transmitted to the test channel. After receiving the data from the test channel again, the data writing channel writes the data back to the memory unit at a second time. A time delay is rendered when the data is transmitted through the test channel, and a time interval between the first time and the second time can be adjusted to correctly write the data back to the memory unit. Therefore, the memory test system is suitable for a high speed test.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A memory test system, for testing a memory unit, comprising:
   a control unit, generating and outputting a first read command and a first write command according to an external command;
   a data reading channel, coupled to the memory unit and the control unit and reading data from the memory unit according to the first read command;
   a data writing channel, coupled to the memory unit and the control unit and writing the data to the memory unit according to the first write command; and
   a test channel, coupled to the data reading channel and the data writing channel, and having an input end and an output end, wherein the input end receives the data from the data reading channel, and the output end transmits the data back to the data writing channel, the data writing channel receives the data after a time delay,
   wherein when each time the external command is received by the control unit, the first read command and the first write command are generated and respectively outputted to the data reading channel and the data writing channel, the data reading channel receives the first read command at a first time before the data writing channel receives the first write command at a second time, a time interval between the first time and the second time is substantially equal to the time delay, and the time interval comprises a generation time of the first write command by the control unit and a programmable offset time.

2. The memory test system as claimed in claim 1, wherein the programmable offset time is adjusted by the control unit such that the time interval is substantially equal to the time delay.

3. The memory test system as claimed in claim 1, wherein the time delay is rendered when the data is read from the memory unit by the data reading channel, outputted to the input end of the test channel and transmitted back to the data writing channel.

4. The memory test system as claimed in claim 1, wherein the data reading channel comprises:
   at least one multiplexer, selecting memory banks of the memory unit to read the data according to the first read command.

5. The memory test system as claimed in claim 1, wherein the data writing channel comprises:
   at least one multiplexer, selecting memory banks of the memory unit to write the data according to the first write command.

6. The memory test system as claimed in claim 1, wherein the memory unit comprises at least one memory array, the data is read from and written into a same memory bank or the different memory banks of the at least one memory array.

7. The memory test system as claimed in claim 6, wherein the data is read from and written into a same column address or the different column addresses of the at least one memory array.

8. The memory test system as claimed in claim 1, wherein the test channel comprises a first pad, a second pad and a transmission channel, the first pad is coupled to the input end, the second pad is coupled to the output end, and the transmission channel is coupled between the first pad and the second pad, the data is transmitted from the first pad to the second pad through the transmission channel.

9. The memory test system as claimed in claim 8, wherein the test channel further comprises:
   a transmission unit, coupled between the input end and the first pad for receiving the data from the data reading channel and transmitting the data to the first pad, wherein the first pad is coupled to the input end via the transmission unit; and
   a reception unit, coupled between the second pad and the output end for receiving the data from the second pad and transmitting the data to the data writing channel, wherein the second pad is coupled to the output end via the reception unit.

10. The memory test system as claimed in claim 1, wherein the external command is an external write command, an external read command or an external write and read command.

11. The memory test system as claimed in claim 1, wherein the external command operates in a first frequency, the data reading channel and the data writing channel operate in a second frequency, and the test channel operates in a third frequency.

12. A memory testing method, adapted by a control unit, comprising:
   generating a first read command and a first write command according to an external command;
   outputting the first read command to a data reading channel in order to read data from a memory unit at a first time;
   transmitting the data to an input end of a test channel by the data reading channel; and
   receiving the data from an output end of the test channel by a data writing channel after a time delay and outputting the first write command to the data writing channel to write the data into the memory unit at a second time,
   wherein a time interval between the first time and the second time is substantially equal to the time delay, and the time interval comprises a generation time of the first write command and a programmable offset time.

13. The memory testing method as claimed in claim 12, wherein the memory testing method further comprises:
   adjusting the programmable offset time so that the time interval is substantially equal to the time delay.

14. The memory testing method as claimed in claim 12, wherein the time delay is rendered when the data is read from the memory unit by the data reading channel, outputted to the input end of the test channel and transmitted back to the data writing channel.

15. The memory testing method as claimed in claim 12, wherein the method of reading the data from the memory unit and writing the data into the memory unit further comprises:
   selecting memory banks of the memory unit to read the data according to the first read command; and
   selecting the memory banks of the memory unit to write the data according to the first write command.

16. The memory testing method as claimed in claim 12, wherein the memory unit comprises at least one memory array, and the method of reading the data from the memory unit and writing the data into the memory unit further comprises:
   selecting a memory bank or the different memory banks of the at least one memory array to read and write the data.

17. The memory testing method as claimed in claim 16, wherein the method of reading the data from the memory unit and writing the data into the memory unit further comprises:
   selecting a same column address or the different column addresses of the at least one memory array to read and write the data.

18. The memory test system as claimed in claim 12, wherein the memory testing method further comprises:
   receiving the external command which is an external write command, an external read command or an external write and read command before generating the first read command and the first write command.

* * * * *